US010968512B2

(12) United States Patent
Banerjee et al.

(10) Patent No.: US 10,968,512 B2
(45) Date of Patent: Apr. 6, 2021

(54) CVD COMPOSITE REFRACTORY COATINGS AND APPLICATIONS THEREOF

(71) Applicant: Kennametal Inc., Latrobe, PA (US)

(72) Inventors: Debangshu Banerjee, Irwin, PA (US); Rodrigo Cooper, Greensburg, PA (US)

(73) Assignee: KENNAMETAL INC., Latrobe, PA (US)

( * ) Notice: Subject to any disclaimer, the term of this patent is extended or adjusted under 35 U.S.C. 154(b) by 225 days.

(21) Appl. No.: 16/015,618

(22) Filed: Jun. 22, 2018

(65) Prior Publication Data
US 2018/0371610 A1 Dec. 27, 2018

Related U.S. Application Data

(60) Provisional application No. 62/523,624, filed on Jun. 22, 2017.

(51) Int. Cl.
C23C 16/34 (2006.01)
C23C 16/40 (2006.01)
C04B 35/581 (2006.01)
C04B 35/622 (2006.01)
C04B 35/48 (2006.01)
C04B 35/119 (2006.01)
C04B 41/00 (2006.01)
C23C 28/04 (2006.01)
C04B 35/488 (2006.01)

(52) U.S. Cl.
CPC ............ *C23C 16/34* (2013.01); *C04B 35/119* (2013.01); *C04B 35/48* (2013.01); *C04B 35/488* (2013.01); *C04B 35/581* (2013.01); *C04B 35/62222* (2013.01); *C04B 41/00* (2013.01); *C23C 16/403* (2013.01); *C23C 16/405* (2013.01); *C23C 28/042* (2013.01); *C23C 28/044* (2013.01); *C04B 2235/3217* (2013.01); *C04B 2235/3244* (2013.01); *C04B 2235/3886* (2013.01); *C04B 2235/788* (2013.01); *C04B 2235/80* (2013.01)

(58) Field of Classification Search
CPC ..... C23C 16/34; C23C 16/403; C23C 16/405; C04B 35/48; C04B 35/488; C04B 35/62222
USPC .......... 51/307, 309; 428/336, 697, 698, 699, 428/701, 702
See application file for complete search history.

(56) References Cited

U.S. PATENT DOCUMENTS

| 4,240,871 | A | | 12/1980 | Burkhart et al. | |
|---|---|---|---|---|---|
| 4,701,384 | A | * | 10/1987 | Sarin | C04B 41/009 428/701 |
| 4,702,970 | A | * | 10/1987 | Sarin | C04B 41/5025 428/698 |
| 5,827,570 | A | * | 10/1998 | Russell | C04B 35/62222 427/255.34 |
| 6,040,012 | A | | 3/2000 | Anderbouhr | |
| 6,238,739 | B1 | * | 5/2001 | Madar | C23C 16/34 118/719 |
| 6,811,580 | B1 | * | 11/2004 | Littecke | C04B 41/009 428/699 |
| 7,276,301 | B2 | * | 10/2007 | Tsushima | C23C 16/0272 428/336 |
| 7,597,511 | B2 | * | 10/2009 | Tomita | C23C 16/0272 51/307 |
| 8,389,134 | B2 | * | 3/2013 | Van Den Berg | C23C 30/005 428/697 |
| 8,748,016 | B2 | * | 6/2014 | Endler | C23C 16/34 428/697 |
| 2002/0028323 | A1 | * | 3/2002 | Nakamura | C23C 30/005 428/701 |
| 2010/0233511 | A1 | * | 9/2010 | Endler | C23C 28/044 428/698 |
| 2014/0287229 | A1 | * | 9/2014 | Wendt | C23C 16/40 428/336 |
| 2015/0064452 | A1 | * | 3/2015 | Pitonak | C23C 16/34 428/336 |

(Continued)

FOREIGN PATENT DOCUMENTS

| CA | 2613091 | 1/2007 |
|---|---|---|
| EP | 899359 | 3/1999 |
| EP | 1122334 | 8/2001 |

(Continued)

OTHER PUBLICATIONS

Martensson Influence of the concentration of ZrCl4 on the texture, morphology and growth rate of CVD grwon (alpha) Al2O3 coatings depoisted by the AlCl3/ZrCl4/H2/Co2/H2S process. Surface & Coatings Techn 200 p. 3626-3632. (Year: 2006).*
Nov. 15, 2016 Office Action KW-02670-JP-PCT.
Bearden, X-Ray Emission Lines from "X-Ray Wavelengths," Review of Modern Physics, Jan. 1967. p. 86-99.
Wikipedia, "Frasen", 2017.
Wikipedia, "Energiedispersive Rontgenspektroskopie". 2017.
The Twelfth Frontiers of Electron Microscopy in Materials Science. Journal of Electron Microscopy, Sep. 25, 2009.
Mar. 8, 2016 Second Office Action KW-02670-CN-PCD[2].
May 13, 2016 Search Report KW-02670-EP-ETD.
M. Kathrein et al., "Wear Protection in Cutting Tool Applications", 15th International Plansee Seminar, 2001. vol. 1.

(Continued)

*Primary Examiner* — Archene A Turner
(74) *Attorney, Agent, or Firm* — Larry R. Meenan

(57) ABSTRACT

In one aspect, articles are described comprising wear resistant coatings employing composite architectures including refractory layers of varying compositions and phases. Briefly, a coated article comprises a substrate and a coating deposited by chemical vapor deposition (CVD) adhered to the substrate, the coating comprising an inner refractory layer comprising $M_{1-x}Al_xN$ wherein x≥0.7 and M is titanium, chromium or zirconium and an outer zirconia layer or outer multiphase refractory layer comprising an alumina phase and an oxide phase comprising at least one Group IVB metal, wherein the $M_{1-x}Al_xN$ has less than 15 weight percent hexagonal phase.

20 Claims, No Drawings

(56) References Cited

U.S. PATENT DOCUMENTS

| | | | |
|---|---|---|---|
| 2015/0158094 A1* | 6/2015 | Igarashi | C23C 16/36 |
| | | | 428/216 |
| 2018/0057934 A1* | 3/2018 | Cooper | C23C 16/56 |

FOREIGN PATENT DOCUMENTS

| | | | |
|---|---|---|---|
| EP | 1825943 | | 8/2007 |
| JP | 09-125249 | * | 5/1997 |
| JP | 2000505507 A | | 5/2000 |
| JP | 2001254177 | | 9/2001 |
| JP | 2001341008 A | | 12/2001 |
| JP | 2005138209 | | 6/2005 |
| JP | 2006-289557 | * | 10/2006 |
| JP | 2008126334 A | | 6/2008 |
| RU | 2131330 | | 6/1999 |
| RU | 2173241 | | 9/2001 |
| WO | WO2000070120 A1 | | 11/2000 |
| WO | WO2006064724 A1 | | 6/2006 |
| WO | WO2007003648 A1 | | 1/2007 |
| WO | WO2008059896 | | 5/2008 |
| WO | WO2009112115 | | 9/2009 |

OTHER PUBLICATIONS

L. Endler, et al., "Novel aluminium-rich TiAlN Coatings by LPCVD", Surface & Coatings Technology, 2008, vol. 203, p. 530-533.
Jan. 25, 2016 Second Office Action KW-02670-KR-PCT.
Selection System for Inserts, Kennametal Catalogue, 2001.
Kutschej, K., "Structure, mechanical and tribological properties", Surface & Coatings Technology, 2005, vol. 200, p. 2358-2365.
Kim Byoung-June et al., "High temperature oxidation of (Ti1-XAlX)N coatings made by plasma enhanced chemical vapor deposition", Journal of Vacuum Science and Technology, 1999, vol. 17, No. 133.
Fraunhofer, Jahresbericht, Fraunhofer Institut Keramische Technologien und Systeme, 2005.
I. Endler et al., Aluminum-rich Ti1-XAlXN Coatings by CVD, Euro PM 2006.
HORIBA EMAX 7000 Brochure.
Al-rich Ti1-XAlXN—A New CVD Layer, Fraunhofer Advancer, Mar. 2012.
Jul. 26, 2016 Third Office Action KW-02670-KR-PCT.
Sep. 15, 2016 Opposition KW-02670-JP-PCT.
Jun. 20, 2016 EPO Notification R70a(2) R70(2) KW-02670-EP-ETD.
Declaration of inventor Yuuzoh Fukunaga Jun. 29, 2017.
A. Escudeiro Santana et al., "The role of hcp-AlN on hardness behavior of Ti1-XAlXN nanocomposite during annealing", Thin Solid Films, 2004, vol. 469-470, p. 339-344.
Feb. 26, 2019 Office Acton KW-02670-BR-PCT.
Aug. 28, 2018 Office Action KW-02670-BR-PCT.
Jul. 31, 2015 First Office Action KW-02670-KR-PCT.
Jun. 30, 2015 First Office Action KW-02670-CN-PCD[2].
May 12, 2015 Office Action KW-02670-JP-PCT.
Zhou et al 1, Phase Transition and Properties of Ti-Al-N Thin Films Prepared by R. F.-Plasma Assisted Magnetron Sputtering, Thin Solid Films 339 (1999) 203-206203-208 1999.
Jul. 23, 2019 Foreign OA KW-02670-BR-PCT.
Tool Wear Mechanism.
Robert Cep et al., Testing Ceramics Inserts at Irregular Interrupted Cut.
H. Negishi et al., Study on Tool Failure.
A.J. Pekelharing, Cutting Tool Damage in Interrupted Cutting.

* cited by examiner

CVD COMPOSITE REFRACTORY COATINGS AND APPLICATIONS THEREOF

RELATED APPLICATION DATA

The present application claims priority under 35 U.S.C. § 119(e) to U.S. Provisional Patent Application Ser. No. 62/523,624 filed Jun. 22, 2017, which is incorporated herein by reference in its entirety.

FIELD

The present invention relates to refractory coatings and, in particular, to composite refractory coatings deposited by chemical vapor deposition (CVD) for cutting tool and/or wear applications.

BACKGROUND

Cutting tools, including cemented carbide cutting tools, have been used in both coated and uncoated conditions for machining various metals and alloys. In order to increase cutting tool wear resistance, performance and lifetime, one or more layers of refractory material have been applied to cutting tool surfaces. TiC, TiCN, TiN and/or $Al_2O_3$, for example, have been applied to cemented carbide substrates by CVD and by physical vapor deposition (PVD). While effective in inhibiting wear and extending tool lifetime in a variety of applications, refractory coatings based on single or multi-layer constructions of the foregoing refractory materials have increasingly reached their performance limits, thereby calling for the development of new coating architectures for cutting tools.

SUMMARY

In one aspect, articles are described comprising wear resistant coatings employing composite architectures including refractory layers of varying compositions and phases. Briefly, a coated article comprises a substrate and a coating deposited by chemical vapor deposition (CVD) adhered to the substrate, the coating comprising an inner refractory layer comprising $M_{1-x}Al_xN$ wherein $x \geq 0.7$ and M is titanium, chromium or zirconium and an outer zirconia layer or outer multiphase refractory layer comprising an alumina phase and an oxide phase comprising at least one Group IVB metal, wherein the $M_{1-x}Al_xN$ has less than 15 weight percent hexagonal phase.

In some embodiments, the Group IVB metal is zirconium resulting in a zirconia phase uniformly or heterogeneously dispersed in the alumina phase. These and other embodiments are described further in the detailed description which follows.

DETAILED DESCRIPTION

Embodiments described herein can be understood more readily by reference to the following detailed description and examples and their previous and following descriptions. Elements, apparatus and methods described herein, however, are not limited to the specific embodiments presented in the detailed description and examples. It should be recognized that these embodiments are merely illustrative of the principles of the present invention. Numerous modifications and adaptations will be readily apparent to those of skill in the art without departing from the spirit and scope of the invention.

In one aspect, a coated article described herein comprises a substrate and a coating deposited by chemical vapor deposition (CVD) adhered to the substrate, the coating comprising an inner refractory layer comprising $M_{1-x}Al_xN$ wherein $x \geq 0.7$ and M is titanium, chromium or zirconium and an outer multiphase refractory layer comprising an alumina phase and an oxide phase comprising at least one Group IVB metal, wherein the $M_{1-x}Al_xN$ has less than 15 weight percent hexagonal phase.

Turning now to specific components, a coated article comprises a substrate. A coated article can comprise any substrate not inconsistent with the objectives of the present invention. For example, a substrate can be a cutting tool or tooling used in wear applications. Cutting tools include, but are not limited to, indexable cutting inserts, end mills or drills. Indexable cutting inserts can have any desired ANSI standard geometry for milling or turning applications. Substrates of coated articles described herein can be formed of cemented carbide, carbide, ceramic, cermet, steel or other alloy. A cemented carbide substrate, in some embodiments, comprises tungsten carbide (WC). WC can be present in a cutting tool substrate in an amount of at least about 80 weight percent or in an amount of at least about 85 weight percent. Additionally, metallic binder of cemented carbide can comprise cobalt or cobalt alloy. Cobalt, for example, can be present in a cemented carbide substrate in an amount ranging from 1 weight percent to 15 weight percent. In some embodiments, cobalt is present in a cemented carbide substrate in an amount ranging from 5-12 weight percent or from 6-10 weight percent. Further, a cemented carbide substrate may exhibit a zone of binder enrichment beginning at and extending inwardly from the surface of the substrate.

Cemented carbide substrates can also comprise one or more additives such as, for example, one or more of the following elements and/or their compounds: titanium, niobium, vanadium, tantalum, chromium, zirconium and/or hafnium. In some embodiments, titanium, niobium, vanadium, tantalum, chromium, zirconium and/or hafnium form solid solution carbides with WC of the substrate. In such embodiments, the substrate can comprise one or more solid solution carbides in an amount ranging from 0.1-5 weight percent. Additionally, a cemented carbide substrate can comprise nitrogen.

As described herein, the CVD coating adhered to the substrate comprises an inner refractory layer comprising $M_{1-x}Al_xN$ wherein $x \geq 0.7$ and M is titanium, chromium or zirconium. In some embodiments, x of a $M_{1-x}Al_xN$ refractory layer described herein has a value selected from Table I.

TABLE I

| Al Content of $M_{1-x}Al_xN$ (at. %) Value of x in $M_{1-x}Al_xN$ |
|---|
| 0.7-0.9 |
| 0.75-0.9 |
| 0.8-0.9 |
| 0.85-0.9 |

$M_{1-x}Al_xN$ of the inner refractory layer exhibits a hexagonal phase content in an amount less than about 15 weight percent. In some embodiments, $M_{1-x}Al_xN$ of the inner refractory layer has hexagonal phase content according to Table II.

TABLE II

| Hexagonal Phase Content of $M_{1-x}Al_xN$ (wt. %) |
| --- |
| ≤10 |
| ≤5 |
| 0.5-15 |
| 0.5-10 |
| 5-10 |
| 0.5-5 |

The inner refractory layer comprising $M_{1-x}Al_xN$ can have any thickness not inconsistent with the objectives of the present invention. The inner refractory layer, for example, can have a thickness of 0.5 μm to 10 μm or 2 μm to 8 μm. In some embodiments, an inner refractory layer comprising $M_{1-x}Al_xN$ has a thickness greater than 5 μm. For example, an inner refractory layer having a construction described herein, including an x value selected from Table I and hexagonal phase content selected from Table II can have a thickness selected from Table III.

TABLE III

| Refractory Layer Thickness (μm) Thickness μm |
| --- |
| 1-10 |
| 1-5 |
| 2-10 |
| 3-15 |
| 5-20 |

Refractory layer thicknesses described herein can be measured on a flank surface of the cutting tool.

In some embodiments, $M_{1-x}Al_xN$ of the inner refractory layer can have lamellar structure comprising lamellae with thickness generally less than 200 nm. In some embodiments, thickness of individual lamellae can range from 5 nm to 150 nm. Lamellae can exhibit a substantially uniform composition over the thickness of the $M_{1-x}Al_xN$ layer. Alternatively, lamellae composition can vary over thickness of the $M_{1-x}Al_xN$ layer. Aluminum content, for example, can vary between the lamellae, thereby establishing aluminum gradient(s) in the $M_{1-x}Al_xN$ layer. Aluminum content can vary periodically or aperiodically over the $M_{1-x}Al_xN$ layer with the requirement that the average value for x is at least 0.7. In some embodiments, compositional gradients of aluminum exist in the absence of lamellae formation.

In further embodiments, the inner refractory layer comprising $M_{1-x}Al_xN$ can exhibit a multilayer architecture. The inner refractory layer, for example, can comprise sublayers of $M_{1-x}Al_xN$. Sublayers of $M_{1-x}Al_xN$ can have any desired thickness not inconsistent with the objectives of the present invention. In some embodiments, $M_{1-x}Al_xN$ sublayers have individual thickness of 10 nm to 500 nm. In other embodiments, $M_{1-x}Al_xN$ sublayer thickness can be greater than 100 nm and less than 1 μm. $M_{1-x}Al_xN$ sublayers can be present in sufficient number to achieve thickness values provided in Table III herein. Additionally, compositional gradients can exist between the sublayers with the requirement that the average value for x over the sublayer population is at least 0.7.

In some embodiments, the inner refractory layer comprising $M_{1-x}Al_xN$ is deposited directly on the substrate. In other embodiments, one or more bonding layers may reside between the inner layer and the substrate. Bonding layer(s), in some embodiments, comprise one or more metallic elements selected from the group consisting of aluminum and metallic elements of Groups IVB, VB and VIB of the Periodic Table and one or more non-metallic elements selected from Groups IIIA, IVA, VA and VIA of the Periodic Table. In some embodiments, one or more bonding layers between the substrate and inner $M_{1-x}Al_xN$ refractory layer comprise a carbide, nitride, carbonitride, oxycarbonitride, oxide or boride of one or more metallic elements selected from the group consisting of aluminum and metallic elements of Groups IVB, VB and VIB of the Periodic Table.

For example, one or more bonding layers are selected from the group consisting of titanium nitride, titanium carbonitride, titanium oxycarbonitride, titanium carbide, zirconium nitride, zirconium carbonitride, hafnium nitride and hafnium carbonitride. Bonding layer(s) of the coating can have any thickness not inconsistent with the objectives of the present invention. In some embodiments, a single bonding layer can have a thickness of at least 0.5 μm. Alternatively, a plurality of bonding layers can collectively achieve thickness of at least 1 μm.

The coating deposited by CVD also comprises an outer multiphase refractory layer comprising an alumina phase an oxide phase comprising at least one Group IVB metal. In some embodiments, the oxide phase is dispersed in the alumina phase. The oxide phase, for example, can be uniformly dispersed in the alumina phase or heterogeneously dispersed in the alumina phase, thereby producing one or more gradients of Group IVB metal oxide. Moreover, grain size of the oxide phase can be generally uniform throughout the alumina phase. Alternatively, grain size of the oxide phase can vary with thickness of the multiphase refractory layer. In some embodiments, grain size of the oxide phase decreases in a direction proceeding away from the substrate. In other embodiments, grain size of the oxide phase increases in a direction proceeding away from the substrate. In further embodiments, the oxide phase may only reside at grain boundaries of the alumina phase.

The oxide phase, in some embodiments, comprises a singular oxide of zirconium, titanium or hafnium. In other embodiments, any combination of zirconia ($ZrO_2$), titania ($TiO_2$) and/or hafnia ($HfO_2$) can form the oxide phase.

In a particular embodiment, the Group IVB metal oxide phase comprises zirconia. The zirconia phase can be present in the multiphase refractory layer in any amount not inconsistent with the objectives of the present invention. In some embodiments, the zirconia phase is present in an amount of 5-60 weight percent of the multiphase refractory layer. The zirconia phase, in some embodiments, is present in an amount selected from Table IV.

TABLE IV

| $ZrO_2$ Content of Multiphase Refractory Layer (wt. %) |
| --- |
| 10-50 |
| 20-40 |
| 30-40 |
| 5-30 |
| 5-25 |
| 35-50 |

The zirconia phase can primarily exhibit a monoclinic crystalline structure. In some embodiments, the zirconia phase comprises a mixture of monoclinic and tetragonal crystalline phases. For example, the zirconia phase can be 60-99.9% monoclinic with the remainder tetragonal. In other embodiments tetragonal phase is present in the zirconia phase in an amount of 1-35% or 5-30%.

The zirconia phase, in some embodiments, is dispersed within the alumina phase. For example, the zirconia phase can be dispersed throughout the alumina phase. In other embodiments, the zirconia phase is heterogeneously distributed in the alumina phase, thereby producing one or more zirconia gradients. Additionally, grains of the zirconia phase can generally exhibit a columnar morphology. In some embodiments, for example, zirconia grains have an aspect ratio greater than 1.3 with the long axis normal or substantially normal to the substrate.

Further, the zirconia phase may exhibit low levels of residual tensile stress in the as-deposited state. In some embodiments, the zirconia phase exhibits residual tensile stress of 100-400 MPa in the as-deposited state. In other embodiments, tensile stress of the as-deposited zirconia phase ranges from 150-300 MPa. Residual stress and shear stress are determined by x-ray diffraction using the Chi tilt $Sin^2 \psi$ method with reference to the (002) reflection of the monoclinic zirconia crystalline phase. Data was collected on a Bragg diffractometer and processed as set forth above.

Peak data was then corrected for Absorption and Transparency using the following equations:

Absorption Correction $$A = \left[1 - \frac{\tan(\omega - \theta)}{\tan\theta}\right] \times \left[1 - e^{\left(-\upsilon t \times \frac{2\sin\theta \times \cos(\omega-\theta)}{\sin^2\theta - \sin^2(\omega-\theta)}\right)}\right]$$

Transparency Correction $$\Delta 2\theta = \frac{180}{\pi} \times \frac{2\tau}{R} \times \frac{\sin(\theta)\cos(\theta)}{\sin(\omega)}$$

$$\text{with } \tau = \frac{t}{\beta} \times \frac{(1-\beta) \times e^{-\beta} - e^{-\beta}}{1 - e^{-\beta}}$$

$$\text{and } \beta = \frac{2\mu t \sin\theta \times \cos(\omega - \theta)}{\sin^2\theta - \sin^2(\omega - \theta)}$$

where:
t=thickness of layer
μ=linear absorption coefficient (cm$^{-1}$)
θ=2Theta/2 (degrees)
(ω−θ)=omega offset angle (degrees)
ψ=tilt angle (Psi stress) (degrees)
τ=information depth (microns)
R=Radius of goniometers (mm)

The peak data was corrected for Lorentz polarization using the following equation:

Polarization Correction $$LP = \frac{\cos^2 2\theta_{mon} \times \cos^2 2\theta}{\sin\theta}$$

$2\theta_{mon}$=diffraction angle of graphite monochromator

The Kα2 peaks were removed using the Ladell model. Peak positions were refined using a Pearson shape profile function.

The residual stress was calculated from the general equation:

$$\frac{d_{\varphi\psi} - d_0}{d_0} = S_1(\sigma_1 + \sigma_2) + \frac{1}{2}S_2\sigma_\varphi\sin^2\psi$$

where $\sigma_{100} = \sigma_1 \cos^2 \varphi + \sigma_2 \sin^2 \varphi$
$d_{\varphi\psi}$=lattice constant at angle φ and tilt ψ
$d_o$=strain free lattice constant
φ=rotation angle
ψ=specimen tilt
$\sigma_1$ & $\sigma_2$=primary stress tensors in specimen surface
$\sigma_{100}$=stress at φ rotation angle
$S_1$ & ½ $S_2$=X-ray elastic constants $$S_1 = \frac{-\upsilon}{E}$$

$$\frac{1}{2}S_2 = \frac{1+\upsilon}{E}$$

For the present zirconia analysis, Poisson's Ratio (υ) was set to 0.23, and the elastic modulus (E in GPa) was determined from literature to be 220.

The alumina phase can be present in the multiphase refractory layer in any amount not inconsistent with the objectives of the present invention. In some embodiments, the alumina phase is the principal phase of the multiphase refractory layer. For example, the alumina phase can be present in an amount of 55-95 weight percent of the multiphase refractory layer. Alternatively, the alumina phase is present in an amount less than the oxide phase. Depending on CVD conditions, the alumina phase can be α-alumina, κ-alumina or mixtures (α/κ) thereof. Moreover, the alumina phase can be doped with zirconium, titanium and/or hafnium. In some embodiments, Group IVB metal is present in the alumina phase in an amount of 0.1 to 5 weight percent of the alumina phase. Group IVB metal may also be present in the alumina phase in an amount selected from Table V.

TABLE V

| Group IVB Dopant (wt. % of Alumina Phase) |
| --- |
| 0.5-30 |
| 1-15 |
| 2-10 |
| 5-20 |

The presence of Group IVB metal dopant in the alumina phase necessarily alters the alumina lattice. Alteration of the alumina lattice by incorporation of Group IVB metal dopant is evidenced by XRD.

Similar to the zirconia phase, grains of the alumina phase can also exhibit a columnar morphology with the long axis normal or substantially normal to the substrate. Further, the alumina phase can exhibit low residual tensile stress in the as-deposited state. In some embodiments, the alumina phase has a residual tensile stress of 200-600 MPa or 250-500 MPa in the as-deposited state. Residual stress of the alumina phase can be determined using the Chi tilt $Sin^2 \psi$ method with reference to the (116) reflection. For the alumina phase analysis, Poisson's Ratio (υ) was set to 0.19, and the elastic modulus (E in GPa) was determined to be 415 from analysis of a single phase α-alumina coating by nanoindentation hardness.

Quantitative analyses of the $M_{1-x}Al_xN$, alumina, and Group IVB metal oxide phases of the CVD coating are administered using the Rietveld method. Data is collected using a Bragg diffractometer and processed as set forth above. All phases in the collected pattern are identified and structure data is selected for each phase for the Rietveld analysis. To keep the Rietveld analysis consistent, the same structure data is used for all analyses of the coating. The structure data used is taken from the ICDD PDF4 2015 database. The structure data used is from the following cards:

04-001-7278 Zirconium Oxide (tetragonal)
    04-004-4339 Zirconium Oxide (monoclinic)
    04-006-0204 Titanium OxyCarbonNitride
    03-065-9875 Titanium Carbonitride
    04-006-9359 Alumina (alpha)
    04-012-6907 Alumina (kappa)
    04-016-3697 Tungsten Carbide Additional cards for $M_{1-x}Al_xN$ and other Group IVB metal oxides are available from the ICDD database. In the Rietveld refinement parameters for the collected data is corrected for:

Specimen Displacement
    Zero Shift
    Background profiled using the Chebyshev profile Rietveld refinement parameters for each phase are:

Scale factor
    Lattice parameters
    Caglioti V
    Caglioti W
    Any orientation in the patterns is corrected using spherical harmonics.

To insure the correctness of the Rietveld refinement all phases in the sample need to be refined. Refinement is continued until a Goodness of Fit of at least 0.9 (90%) is achieved. Once refinement is complete all phases other than the phase in the composite layer are removed from the refinement and the composite layer phases are normalized to 100%.

The outer multiphase refractory layer can have any thickness not inconsistent with the objectives of the present invention. In some embodiments, the outer multiphase refractory layer comprising alumina and oxide phases has thickness of 0.1 μm-15 μm. Thickness of the outer multiphase refractory layer can be selected from Table VI.

TABLE VI

| Outer Multiphase Refractory Layer Thickness (μm) |
| --- |
| 0.5-10 |
| 1-5 |
| 5-10 |
| 0.1-5 |

In some embodiments, the outer multiphase layer comprises sublayers of alumina, zirconia and/or other metal oxide. For example, multiphase sublayers comprising alumina and oxide phases can alternate with sublayers of alumina and/or zirconia or other transition metal oxide. The multiphase sublayers can have any thickness not inconsistent with the objectives of the present invention. In some embodiments, multiphase sublayers have individual thickness of 10 nm to 500 nm. Similarly, sublayers of alumina, zirconia or other metal oxide can individual thickness of 10 nm to 500 nm. Multiphase sublayers can periodically alternate with sublayers of alumina, zirconia or other metal oxide. In other embodiments, multiphase sublayers can alternate with sublayers of alumina, zirconia or other metal oxide in an aperiodic manner.

In further embodiments, the multiphase refractory layer is substituted by a zirconia layer. In such embodiments, the zirconia refractory layer can be 60-99.9% monoclinic with the remainder tetragonal. In other embodiments tetragonal phase is present in the zirconia phase in an amount of 1-35% or 5-30%.

The zirconia refractory layer can also have thickness selected from Table VII herein.

In some embodiments, the outer multiphase refractory layer or zirconia layer is deposited directly on the inner refractory layer comprising $M_{1-x}Al_xN$. Alternatively, a coating described herein can further comprise one or more intermediate layers between the multiphase refractory layer and the inner layer comprising $M_{1-x}Al_xN$. Intermediate layer(s), in some embodiments, comprise one or more metallic elements selected from the group consisting of aluminum and metallic elements of Groups IVB, VB and VIB of the Periodic Table and one or more non-metallic elements selected from Groups IIIA, IVA, VA and VIA of the Periodic Table. In some embodiments, one or more intermediate layers comprise a carbide, nitride, carbonitride, oxycarbonitride, oxide or boride of one or more metallic elements selected from the group consisting of aluminum and metallic elements of Groups IVB, VB and VIB of the Periodic Table.

For example, one or more intermediate layers are selected from the group consisting of titanium nitride, titanium carbonitride, titanium oxycarbonitride, titanium carbide, zirconium nitride, zirconium carbonitride, hafnium nitride and hafnium carbonitride. Intermediate layer(s) of the coating can have any thickness not inconsistent with the objectives of the present invention. In some embodiments, a single intermediate layer can have a thickness of at least 1.5 μm. Alternatively, a plurality of intermediate layers can collectively achieve thickness of at least 1.5 μm.

The outer multiphase refractory layer or zirconia layer can be the outermost layer of the coating. Alternatively, a coating described herein can comprise one or more outermost layers over the multiphase refractory layer or zirconia layer. Outermost layer(s) can comprise one or more metallic elements selected from the group consisting of aluminum and metallic elements of Groups IVB, VB and VIB of the Periodic Table and one or more non-metallic elements selected from Groups IIIA, IVA, VA and VIA of the Periodic Table. Outermost layer(s) over the refractory layer can comprise a carbide, nitride, carbonitride, oxycarbonitride, oxide or boride of one or more metallic elements selected from the group consisting of aluminum and metallic elements of Groups IVB, VB and VIB of the Periodic Table. For example, one or more outermost layers are selected from the group consisting of titanium nitride, titanium carbonitride, titanium oxycarbonitride, titanium carbide, zirconium nitride, zirconium carbonitride, hafnium nitride, hafnium carbonitride and alumina and mixtures thereof.

Outermost layer(s) of coatings described herein can have any thickness not inconsistent with the objectives of the present invention. A coating outermost layer, in some embodiments, can have a thickness ranging from 0.2 μm to 5 μm.

As described herein, the inner refractory layer comprising $M_{1-x}Al_xN$ is deposited by CVD. Accordingly, the inner refractory layer can generally be deposited from a gaseous mixture comprising titanium chloride, aluminum chloride and ammonia, when M is titanium. In some embodiments, the inner refractory layer comprising $Ti_{1-x}Al_xN$ is deposited according to the parameters in Table VII.

TABLE VII

CVD Parameters for $Ti_{1-x}Al_xN$
Ranges of Processing Parameters for TiAlN Layer

| | |
|---|---|
| Temperature | 750-850° C. |
| Pressure | 5-40 mbar |
| Time | 30-300 min |
| $H_2$ | Balance |
| $AlCl_3$ | 0.5-2.0 vol. % |
| $TiCl_4$ | 0.1-0.5 vol. % |
| NH3 | 1-8 vol. % |
| $N_2$ | 5-40 vol. % |
| Ar | 0-25 vol. % |

The multiphase refractory layer is also deposited by CVD. The multiphase refractory layer can be deposited from a gaseous mixture of $H_2$, $N_2$, $CO_2$, HCl, $AlCl_3$, $ZrCl_4$ and $H_2S$. The $AlCl_3$ and $ZrCl_4$ can be simultaneously introduced into the deposition chamber during initiation and growth of the multiphase refractory layer. The presence of $ZrCl_4$ during nucleation of the multiphase refractory layer differs from prior techniques where an alumina layer is first nucleated and $ZrCl_4$ is subsequently introduced during alumina layer growth. The present CVD method also differentiates prior techniques where alumina and zirconia layers are grown independently of one another in a layered format. In some embodiments, $AlCl_3$ and $ZrCl_4$ are formed in separate generators from metal chips and HCl at 350-400° C. General CVD processing parameters for depositing the multiphase refractory layer are provided in Table VIII.

TABLE VIII

Multiphase Refractory Layer CVD Processing Parameters

| Process Step | $H_2$ vol. % | Ar vol. % | $N_2$ vol. % | $CO_2$ vol. % | HCl vol. % | $H_2S$ vol. % | $AlCl_3$ vol. % | $ZrCl_4$ vol. % |
|---|---|---|---|---|---|---|---|---|
| $Al_2O_3/ZrO_2$ Layer | Bal. | 0-10 | 0-6 | 4-7 | 1.5-2.5 | 0.05-0.15 | 0.5-3 | 0.2-2.5 |

General CVD deposition parameters for various bonding and/or intermediate layers are provided in Table IX.

TABLE IX

CVD Parameters for Bonding/Intermediate Layer Deposition

| Base Layer Composition | Gas Mixture | Temperature ° C. | Pressure mbar | Duration min. |
|---|---|---|---|---|
| TiN | $H_2$, $N_2$, $TiCl_4$ | 800-900 | 60-100 | 10-90 |
| MT-TiCN | $H_2$, $N_2$, $TiCl_4$, $CH_3CN$ | 750-900 | 65-100 | 50-400 |
| HT-TiCN | $H_2$, $N_2$, $TiCl_4$, $CH_4$ | 900-1050 | 60-160 | 30-200 |
| TiOCN | $H_2$, $N_2$, $TiCl_4$, $CH_4$, CO | 900-1050 | 200-550 | 30-70 |

The foregoing general CVD parameters for bonding or intermediate layer deposition, in some embodiments, can be applied for deposition of one or more outermost layers.

Coatings described herein can be subjected to post-coat treatments. Coatings, for example, can be blasted with various wet and/or dry particle compositions. Post coat blasting can be administered in any desired manner. In some embodiments, post coat blasting comprises shot blasting or pressure blasting. Pressure blasting can be administered in a variety of forms including compressed air blasting, wet compressed air blasting, pressurized liquid blasting, wet blasting and steam blasting. Wet blasting, for example, is accomplished using a slurry of inorganic and/or ceramic particles, such as alumina, and water. The particle slurry can be pneumatically projected at a surface of the coated cutting tool body to impinge on the surface of the coating. The inorganic and/or ceramic particles can generally range in size between about 20 μm and about 100 μm.

Blasting parameters include pressure, angle of impingement, distance to the part surface and duration. In some embodiments, angle of impingement can range from about 10 degrees to about 90 degrees, i.e., the particles impinge the coating surface at an angle ranging from about 10 degrees to about 90 degrees. Suitable pressures can range from 30-55 pounds per square inch (psi) at a distance to the coated surface of 1-6 inches. Further, duration of the blasting can generally range from 1-10 seconds or longer. Blasting can be generally administered over the surface area of the coating or can be applied to select locations such as in a workpiece contact area of the cutting tool. A workpiece contact area can be a honed region of the cutting tool.

In other embodiments, a coating is subjected to a polishing post-coat treatment. Polishing can be administered with paste of appropriate diamond or ceramic grit size. Grit size of the paste, in some embodiments, ranges from 1 μm to 10 μm. In one embodiment, a 5-10 μm diamond grit paste is used to polish the coating. Further, grit paste can be applied to the CVD coating by any apparatus not inconsistent with the objectives of the present invention, such as brushes. In one embodiment, for example, a flat brush is used to apply grit paste to the CVD coating in a workpiece contact area of the cutting tool.

A coating described herein can be blasted or polished for a time period sufficient to achieve a desired surface roughness ($R_a$) and/or other parameters such as reducing residual tensile stress in the coating. In some embodiments, a coating subjected to post-coat treatment has a surface roughness ($R_a$) selected from Table X.

TABLE X

Post-Coat Surface Roughness ($R_a$)
Coating Surface Roughness ($R_a$) - nm

| |
|---|
| ≤500 |
| ≤250 |
| <200 |
| 10-250 |
| 50-175 |
| 25-150 |

Coating surface roughness can be determined by optical profilometry using WYKO® NT-Series Optical Profilers commercially available from Veeco Instruments, Inc. of Plainview, N.Y.

Further, a post-coat treatment, in some embodiments, does not remove one or more outermost layers of the coating. In some embodiments, for example, a post-coat treatment does not remove an outermost layer of TiN, TiCN and/or TiOCN. Alternatively, a post-coat treatment can remove or partially remove one or more outermost layers, such as TiN, TiCN and TiOCN.

Various embodiments of the invention have been described in fulfillment of the various objects of the invention. It should be recognized that these embodiments are merely illustrative of the principles of the present invention. Numerous modifications and adaptations thereof will be readily apparent to those skilled in the art without departing from the spirit and scope of the invention.

The invention claimed is:

1. A coated article comprising:
   a substrate; and
   a coating deposited by chemical vapor deposition (CVD) adhered to the substrate, the coating comprising an inner refractory layer comprising $M_{1-x}Al_xN$ wherein x≥0.7 and M is titanium, chromium or zirconium and an outer multiphase refractory layer comprising an alumina phase and an oxide phase dispersed uniformly or heterogeneously in the alumina phase, the oxide phase comprising zirconia primarily exhibiting monoclinic crystalline structure, wherein the $M_{1-x}Al_xN$ has less than 15 weight percent hexagonal phase.

2. The coated article of claim 1, wherein the 0.7≤x≤0.9.

3. The coated article of claim 1, wherein the $M_{1-x}Al_xN$ has less than 10 weight percent hexagonal phase.

4. The coated article of claim 1, wherein the $M_{1-x}Al_xN$ has less than 5 weight percent hexagonal phase.

5. The coated article of claim 1, wherein the oxide phase is heterogeneously distributed in the alumina phase.

6. The coated article of the claim 1, wherein the oxide phase is present in an amount of 5-60 weight percent of the multiphase refractory layer.

7. The coated article of claim 1, wherein the alumina phase comprises α-alumina, κ-alumina or mixtures thereof.

8. The coated article of claim 1, wherein the zirconia phase comprises a mixture of monoclinic and tetragonal phases.

9. The coated article of claim 8, wherein the zirconia phase is 60-99.9% monoclinic.

10. The coated article of claim 8, wherein the zirconia phase is 1-10% tetragonal.

11. The coated article of claim 1, wherein the inner refractory layer is adhered to the substrate by one or more bonding refractory layers.

12. The coated article of claim 11, wherein the one or more bonding refractory layers comprise one or more metallic elements selected from the group consisting of aluminum and metallic elements of Groups IVB, VB and VIB of the Periodic Table and one or more non-metallic elements of Groups IIIA, IVA, VA and VIA of the Periodic Table.

13. The coated article of claim 1, wherein the inner refractory layer comprising $M_{1-x}Al_xN$ comprises an aluminum gradient.

14. The coated article of claim 1, wherein the inner refractory layer comprising $M_{1-x}Al_xN$ comprises a lamellar structure.

15. The coated article of claim 14, wherein lamellae thickness of the lamellar structure is 10 nm to 200 nm.

16. The coated article of claim 1, wherein the substrate is a cutting tool.

17. The coated article of claim 16, wherein the cutting tool is a cutting insert or rotary cutting tool.

18. The coated article of claim 1, wherein the substrate is cemented carbide, carbide, cermet, ceramic or steel.

19. The coated article of the claim 1, wherein the oxide phase is zirconia and is present in an amount of 20-40 weight percent of the multiphase refractory layer.

20. The coated article of claim 14, wherein the lamellae exhibit a substantially uniform composition over thickness of the inner refractory layer comprising $M_{1-x}Al_xN$.

* * * * *